United States Patent [19]

Bahnck et al.

[11] Patent Number: 4,556,362
[45] Date of Patent: Dec. 3, 1985

[54] METHODS OF AND APPARATUS FOR HANDLING SEMICONDUCTOR DEVICES

[75] Inventors: Norman Bahnck, Bethlehem; Philip Kloap, Coopersburg, both of Pa.

[73] Assignee: AT&T Technologies, Inc., Berkely Heights, N.J.

[21] Appl. No.: 563,726

[22] Filed: Dec. 21, 1983

[51] Int. Cl.[4] .............................................. A23G 9/00
[52] U.S. Cl. ................................ 414/744 B; 414/225; 249/68
[58] Field of Search .................... 414/223, 225, 744 B; 901/6, 7; 425/440; 249/67, 68

[56] References Cited

U.S. PATENT DOCUMENTS 3,377,653  4/1968  Buonaiuto ......................... 249/68 X
3,893,644  7/1975  Drazick .............................. 249/68

Primary Examiner—William E. Wayner
Attorney, Agent, or Firm—W. O. Schellin

[57] ABSTRACT

Apparatus (11) for handling articles (12), such as semiconductor devices, temporarily mounted to an adhesively coated surface of a diaphragm (29) of a mounting frame (21) includes an index table (31) for positioning a selected one of the articles (12) at a pickup axis (34). The article (12) is removed from adhesive contact with the diaphragm (29) by first engaging the underside of the diaphragm with spaced support pins (72) and urging the engaged portions of the diaphragm and the selected article upward while pulling adjacent regions of the diaphragm out of contact with the article by means of an applied vacuum. Then a vacuum tip (112) moves downward toward the selected article as supported in its original orientation in a position raised above a plane of an array of the articles. As the vacuum tip (112) engages the selected article, a central pushpin (78) urges the device out of supportive relationship with the support pins (72) and into contact with the vacuum tip (112) to effect a removal of the article (12) from the diaphragm (29) without tilting the article out of its original orientation.

18 Claims, 10 Drawing Figures

METHODS OF AND APPARATUS FOR HANDLING SEMICONDUCTOR DEVICES

TECHNICAL FIELD

The present invention relates to methods of and apparatus for handling articles, such as semiconductor devices. The invention relates more particularly to removing such articles, as, for example, semiconductor devices from adhesively coated support diaphragms of temporary mounting frames.

BACKGROUND OF THE INVENTION

Semiconductor devices are typically formed in arrays as a plurality of regions in semiconductor wafers. After a sequence of processing steps which complete the devices as integral parts of the wafers, the wafers are severed to yield a plurality of individual devices. The devices are then typically tested and assembled into protective device housings in subsequent operations such as device mounting, lead bonding and packaging operations.

These latter operations typically are sequential operations in contrast to the wafer processing operations which are generally batch-type operations. Sequential operations tend to be more costly than the batch-type operations. However, some economies are obtained by handling techniques which allow the individual devices to remain in supported arrays until the devices become ultimately mounted in individual device packages. Test data on such arrayed devices, even though obtained by sequential tests on the devices, are recorded as arrayed data to correspond directly to the array positions of the tested devices in the arrays. The arrayed test data are used to direct sorting operations, as, for example, to cause the removal of devices having only certain acceptable parameters and to leave untouched all other devices of the original array.

A technique for preserving the array of devices in a wafer after such wafer is severed into individual devices is to mount the wafer onto an adhesively coated film-type diaphragm which is stretched across an opening of a temporary mounting frame. The wafer is then typically sawed along orthogonal boundary lines between the defined devices. The depth of the saw cut is adjusted to slice through the thickness of the wafer without damaging the underlying film-type material of the diaphragm. The individual devices remain attached to the diaphragm after the sawing operation is completed.

As an example, a particular, temporary mounting frame is made of a flat, rectangular metal sheet having a central, circular opening. The diaphragm is a commercially available adhesively coated polymer film which is stretched across the opening and is adhesively attached to the coplanar metal surface of the frame surrounding the opening. A wafer may then be mounted to the adhesively coated film surface in the opening of the frame.

Individual devices which are supported by such a film-type diaphragm may be removed in a typical sorting operation by commercially available sorting apparatus. In a typical sorting operation, the mounting frame is indexed in the plane of the array of devices to align a device selected for removal with a transfer station.

At the transfer station a pushpin is urged from beneath against the selected device, generating stresses between the adhesive coating on the top surface of the diaphragm and the underside of the device, and urging the device out of adhesive contact with and away from the diaphragm. A vacuum probe which is movably mounted above the array moves from above the selected device into contact with its top surface, generating a vacuum hold on the device and carrying the selected device away from the diaphragm.

According to one technique, the pushpin, which is urged against the underside of the device, is pointed. During its upward movement the pin actually pierces the diaphragm and pushes directly against the underside of the selected device. The resulting motion is a positive pulling motion by the device on the adhesive coating to lift the device off the diaphragm. The diaphragm piercing technique is a frequently used technique which works well with comparatively small devices, such as devices which are in a range of a quarter of a millimeter along each edge.

A problem with using the diaphragm-piercing pushpin is related to a vacuum which typically holds down the diaphragm against the upward directed force initiated by the pin. Piercing the diaphragm with the pin appears to have an unfortunate side effect of extending the vacuum from below the diaphragm to the space between the upper surface of the diaphragm and the base of the device. Such a vacuum tends to slow the separation of the device from the adhesive coating. Also, the piercing pin does not appear to sufficiently flex the diaphragm of larger devices to initiate separation of the selected device from the diaphragm at reasonably desirable speeds. Particularly larger devices appear to resist separation from the diaphragm. A stronger upward push by the pin typically alleviates the problem but tends to raise the force exerted against the devices to an undesirably high value at which some devices become damaged.

Another technique of removing selected devices from the adhesively coated diaphragm involves a pin having a blunt tip, as, for example, a rounded tip. Such a tip does not pierce the diaphragm. Instead it merely pushes against the underside of the diaphragm, thereby flexing the surface of the diaphragm to such an extent with respect to the inflexible adjacent surface of the device that the adhesive coating peels from the underside of the device to release its hold on the device. During the upward movement of the pin during which the peeling takes place, the selected device is raised above the plane of the other devices in the array and moves into contact with the vacuum probe.

A problem with such a non-piercing transfer technique is that at times the adhesive coating tends to peel faster on one side of the device than on the other. As a result, devices tend to tilt and remain at least partially in contact with the diaphragm. The tilted devices cannot be contacted squarely by the vacuum probe and are consequently not removed from the array. The problem of having devices in an array tilt can be alleviated by slowing down the upward movement of the pin. Apparently a slow upward movement of the pin allows more time for the adhesive to peel more uniformly from the selected device. Unfortunately, such slowed down movement of the transfer apparatus also results in a less efficient and hence more costly transfer operation.

SUMMARY OF THE INVENTION

Problems of handling articles, such as semiconductor devices, in effecting the removal of such articles from an adhesively coated diaphragm, or problems relating to undesirably slow separation of the articles from the diaphragm are alleviated by improved apparatus for and methods of handling articles to remove them from such adhesively coated diaphragm. In accordance with the invention, a method of handling articles includes holding an array of the articles on an adhesively coated surface of a flexible diaphragm and selecting an article from such array for removal. The method includes contacting an underside of the diaphragm in the region of a vertical projection of the selected article onto the diaphragm with a plurality of spaced support pins and moving the plurality of support pins in unison upward against the diaphragm to raise the selected article while maintaining the orientation of the selected article.

Apparatus for handling articles in accordance with the invention includes provisions for supporting an array of articles mounted to an adhesive coating of a flexible diaphragm. The apparatus has provisions for raising a selected article from the array while supporting the orientation of the article with respect to the array through spaced support contact elements from beneath the diaphragm. A particular feature of the invention includes a provision for reducing the contact regions between the article and the diaphragm while the article is being raised by such provisions for raising the article.

BRIEF DESCRIPTION OF THE DRAWING

Various other features and advantages of the invention will be best understood when the following detailed description is read in reference to the appended drawing wherein:

FIG. 1a shows a side view of the lift mechanism of FIG. 1;

DETAILED DESCRIPTION

The Apparatus And Its Operation

Figure 1:
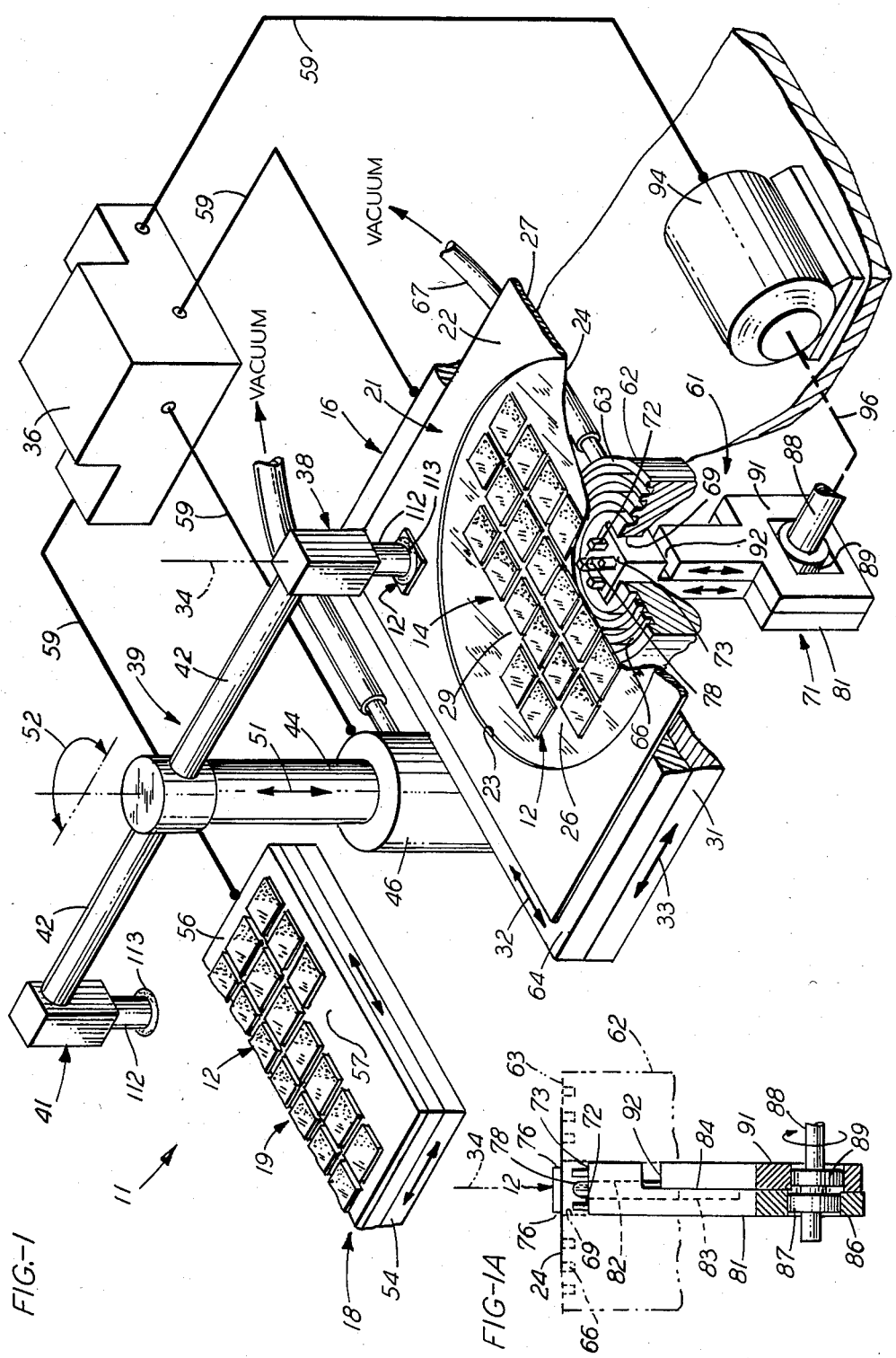
FIG. 1 shows a handling apparatus and particularly a compound device lift mechanism as one of the features of the present invention.

FIG. 1 shows a device handling apparatus 11 in a cutaway representation which highlights major components and illustrates various features of the present invention. Generally described, the apparatus 11 transfers selected devices 12, such as semiconductor integrated circuit devices, from a first array 14 of such devices located at a pickup station 16 to a receiving station 18. At the receiving station 18 the transferred devices are placed into a sorted, second array 19, as shown in FIG. 1, or, alternatively, they may be mounted directly to circuit substrates or become packaged in other ways not shown.

The first array 14 of the devices 12 is shown as being supported by a planar mounting frame 21. The actual framing member is a rigid metal sheet 22 which has a central opening 23 of substantial size so that the remaining material of the sheet 22 forms a frame about the opening 23. An adhesively coated polymer film 24 is attached through an adhesive coating 26 on one surface thereof to one major surface, namely the underside 27 of the frame 21. Looking downward onto the frame 21, in FIG. 1, only an edge of the underside 27 is showing. A central portion of the film 24 stretches across the entire area of the opening 23 as a tightly stretched, yet flexible diaphragm 29. The upwardly exposed adhesive coating 26 on the diaphragm 29 provides a temporary hold for the devices 12 of the first array 14.

The mounting frame 21 is supported by a first X-Y index table 31 which is controllably movable by predetermined increments in two orthogonal directions indicated by arrows 32 and 33. The directions correspond to rows and columns of the array 14. The movement of the index table is controlled to index the devices 12 in the array in succession into alignment with a pickup axis 34.

The indexing movement of the index table is controlled by a typical apparatus control console 36 which coordinates the functions of the apparatus by applying appropriate control signals in accordance with known practices. Typical commercially available handling apparatus may therefore include electronic microprocessor and memory circuits which are programmable to generate appropriate signal sequences.

At the beginning of an operational cycle of the apparatus 11, the mounting frame is translated by a typically electrically activated movement of the index table 31 to center a selected device 12 on the pickup axis 34. At the pickup axis the selected device 12 is located in vertical alignment with and beneath a first rest position of a first transfer head 38 of a transfer mechanism 39. The transfer mechanism 39 supports the first transfer head 38 and preferably a second transfer head 41 on diametrically opposite ends of a horizontal swing arm 42. The swing arm 42 is centrally supported at an upper end 43 of a vertically oriented transfer actuator shaft 44.

The transfer actuator shaft 44 is movably mounted with respect to a typical fixed support structure 46 to reciprocate vertically in the direction of the arrow 51 and to oscillate through 180° about its vertical axis as indicated by arrow 52. Such compound motion is preferably generated by linear and rotational electromagnetic actuators mounted in the support structure 46. Of course, conventional mechanical drive mechanisms, such as a cam drive for the vertical reciprocation of a linkage actuator or an actuator which moves the swing arm through indexed 180° rotations in the same direction, may be employed to yield equivalent motions.

The rotation and vertical reciprocation of the first and second transfer heads 38 and 41 and a selectively applied vacuum at each of the transfer heads interact to enable the transfer mechanism 39 to pick up selected devices 12 at the pickup station and to deposit them at the receiving station 18. A second X-Y index table 54 at the receiving station 18 translates a device carrier 56 in a predetermined travel pattern to advance consecutive vacant array positions 57 to a second rest position of the transfer heads. As one of the transfer heads places one of the transferred devices into such vacant positions, the other transfer head picks up a subsequent device from the array 14. The pattern of travel of the X-Y index table 54 is, like that of the X-Y index table 31, controlled by electrical signals from the control console 36. Suitable cabling 59 couples the index table 54 like other apparatus components to the control console 36.

The Device Lift Mechanism

Centered on the pickup axis is a device lift mechanism which is designated generally by the numeral 61. A support housing 62 of the mechanism 61 is mounted in the apparatus 11 so that a top surface 63 of the housing 62 lies in the same plane as a top surface 64 of the first index table 31. When the mounting frame 21 is placed on the first index table 31 as shown in FIG. 1, the underside of the diaphragm 29 is supported by the top surface 63 of the housing 62.

A plurality of concentric grooves 66 formed in the top surface 63 are coupled through a typical vacuum tube 67 to a conventional vacuum supply. Such a supply includes typical control valves which respond to electrical input signals. A vacuum suction at the top surface 63 of the housing 62 is therefore capable of being selectively activated or deactivated by, for example, control signals from the control console 36. When the mounting frame 21 is located on the index table 31 and the vacuum at the top surface of the housing 62 is activated, a vacuum pull is exerted on the underside of the diaphragm 29. During such portion of an operational cycle of the apparatus 11 during which the mounting frame 21 is indexed to a new array position, the vacuum coupled to the housing 62 remains deactivated to permit the diaphragm 29 to slide freely with respect to the top surface 63 of the housing 62.

The walls of a central aperture 69 through the housing 62 guide and support a vertical, reciprocating motion of a device lift pedestal 71 of the mechanism 61. Four support pins 72 are mounted to an upper end 73 of the pedestal 71 and are located in symmetry about the pickup axis 34. The horizontal spacing of the pins 72 is chosen in relationship to the size of the devices 12. When the index table 31 has indexed a selected device into alignment with the pickup axis 34, the pins 72 are located within the vertical projection of the selected device 12. Preferably the pins 72 are located adjacent to respective corners of the device 12, but are set inward from adjacent edges 76 of such device by about the width of the pin 72, as shown, for example, in FIG. 1a. Top surfaces 74 of the pins 72 are machined flat in a horizontal support plane. When the pedestal is reciprocated into a lowermost rest position, the top surfaces 74 of the pins 72 are preferred to be positioned no higher than the top surface 63 of the housing 62.

Again in reference to FIGS. 1 and 1a, a fifth pin, namely a pushpin 78, is slidably mounted in the center of the pedestal 71 and is, therefore, located on center with the pickup axis 34. FIG. 1a shows a partially sectioned side view of the device lift mechanism 61 showing particular details which support a reciprocating movement of the pedestal 71 and of the pushpin 78.

A lower end 81 of the pedestal 71 is recessed or cut back along an orthogonal plane through its center coincident with the pickup axis 34. Thus, a guide aperture 82 of circular cross section for the pushpin 78 extends as a semicircular, open channel 83 along a recessed surface 84 of the pedestal 71. A lowermost portion of the lower end 81 of the pedestal is shaped into a scotch yoke-type cam follower 86 supported and driven by a first cam lobe 87 of a camshaft 88. A second cam lobe 89 on the shaft 88 drives a second cam follower 91 which is nested against the recessed surface 84 of the pedestal and which is mounted at its upper end 92 to the pushpin 78. Inasmuch as the pushpin 78 is guidedly held in its guide apertrue 82 in the upper end of the pedestal 71, the pedestal 71 retains the second cam follower 91 against the recessed surface 84.

Referring to FIG. 1, a motor 94, preferably a stepping motor, is electrically coupled to control console 36 by the typical cabling 59. The rotational output of the motor drives the camshaft 88 in a conventional drive connection, such as a flexible shaft, as shown by the symbolic drive coupling 96. During each operational cycle for transferring a selected device 12 from the first array 14 to the sorted array 19, the control console 36 energizes the motor 94 to rotate the camshaft 88 through one complete revolution. Simultaneously with the movement of the camshaft, one of the transfer heads 38 or 41 which is, at that time, located in alignment with the pickup axis 34 approaches the selected device 12 from above to remove such device from the diaphragm 29.

Removing The Device From The Diaphragm

Removing one of the selected devices from the diaphragm 29 has in the past met with problems, particularly when the devices 12 to be handled were relatively large devices, such as, for example, devices of approximately 0.5 cm along each edge. The interaction of the previously described elements of the apparatus 11 in alleviating prior art problems and effecting a fast and efficient removal of the device 12 from the diaphragm 29 is best described in reference to the sequence of FIGS. 2 through 7, the top view of the pedestal 71 in FIG. 8, and the timing diagram of FIG. 9.

Figure 2:
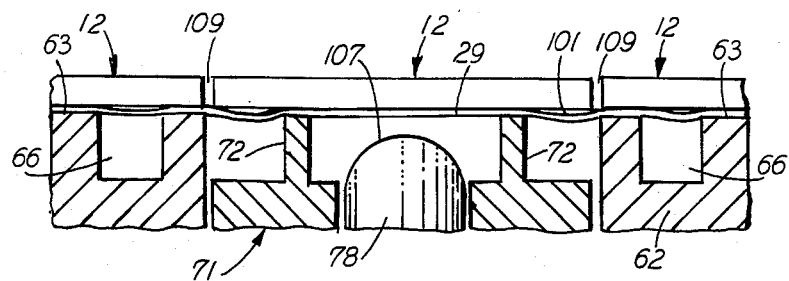
FIGS. 2 through 7 show schematically a sequence of cooperative actions of the compound device lift mechanism and a transfer probe of the apparatus of FIG. 1 for achieving the removal of a device from a diaphragm of a temporary mounting frame.

FIG. 2 shows an initial significant state of an operational cycle to remove the device 12 from the diaphragm 29. A vacuum force from a vacuum applied to the grooves 66 in the top surface 63 of the housing 62 and to spaces between the support pins 72 of the pedestal 71 has begun to peel the diaphragm 29 from the device 12 in peripheral regions 101 about the pins 72. The support pins 72 have moved slightly upward from a preferred rest position slightly below a base line in the plane of the top surface 63 of the housing 64 and their top surfaces 74 are at this instance in the operational cycle substantially flush with the top surface 63.

Figure 9:
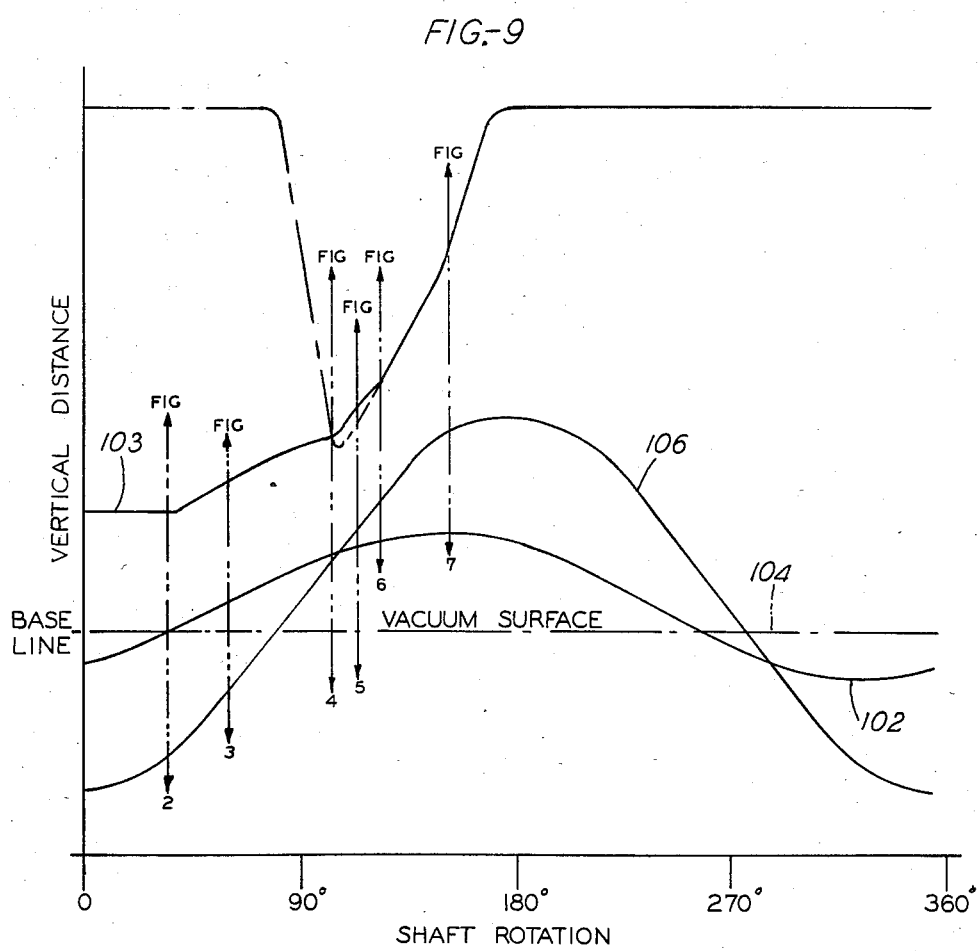
FIG. 9 is a timing diagram illustrating the vertical interrelationship between the device lift mechanism and the transfer probe of the described apparatus.

The described state is depicted in the diagram of FIG. 9 and is particularly identified at the cyclical status indicator arrow designated "FIG. 2." FIG. 9 identifies the reciprocating motion of the top surfaces 74 of the support pins 72 of the pedestal 71 by the sinusoidal curve 102. At the portrayed cyclical state identified by the indicator FIG. 2, the top surface of the device 12, as identified by the line 103, is still at its rest state one device thickness above the base line identified by numeral 104. A second sinusoidal curve 106 of greater vertical amplitude depicts the reciprocating motion of a rounded top 107 of the pushpin 78. As shown in FIG. 2 and in the diagram of FIG. 9 at the cyclical state described with respect to FIG. 2, the top 107 of the pushpin 78 is still well below the base line 104.

Figure 3:
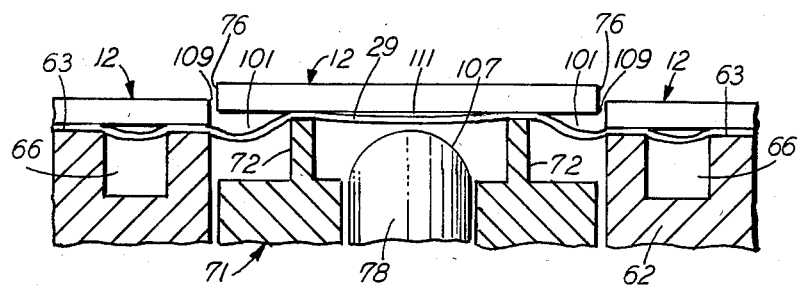

In FIG. 3, the support pins 72 have begun to raise the device 12 above the base line 104, at which the remaining devices 12 are held by the top surface 63 of the support housing 62. It should be noted that the orientation of the selected device 12 parallel to the plane of the array 14 is being maintained by the equal upward motion of the support pins 72 moving in unison.

Maintaining the horizontal orientation of the selected device 12 during the time that it is being lifted from the plane of the array 14 is significant. A typical thickness of a device 12 is, for example, about 530 microns ($530\times10^{-6}$ meters) while the gap between two adjacent ones of the devices 12 as a result of a typical saw cut amounts only to approximately 50 microns. The drawing, consequently, shows the gaps 109 between adjacent ones of the devices 12 at an exaggerated width to highlight the fact that such adjacent devices 12 in the array are, in fact, separate from each other. In reality, a distance of only 50 microns between two adjacent devices 12 is a narrow gap. It has been found that any tilting of the selected device 12 tends to scrape the edges 76 of adjacent ones of the devices 12 against each other, destroying on occasion one or both of the devices which happened to come into contact with each other during the removal of one of them.

The horizontal support of the selected device 12 during its removal from the array 14 is, consequently, significant. However, it is also significant to urge the selected device 12 from its adhesive hold with the diaphragm. It has been found that the separation of the device 12 from the diaphragm 29 is a dynamic process in that a reactive adhesive force which resists a pulling force is related to the vigor with which the device 12 is removed. An attempt to remove the device 12 more rapidly than at any given rate results in a relatively higher resisting force from the adhesive. The interaction of the vacuum and the lift mechanism 61 optimizes time intervals during which contact regions between the diaphragm 29 and the device 12 become reduced in area before the device 12 is actually lifted from the diaphragm 29. Such reduction tends to effectively diminish the resistive adhesive force exerted by the diaphragm 29 at the time of the removal of the device.

FIG. 2 shows an onset of draping of the diaphragm 29 away from the selected device 12. As the device 12 is lifted by the support pins 72 above the array 14 as shown in FIG. 3, further draping of the diaphragm 29 away from the underside of the device 12 takes place in the peripheral regions 101 about the pins 72. In addition, the adhesive starts to separate from the device 12 toward the center of the device as the diaphragm 29 begins to drape away from the device 12 in regions 111 between adjacent ones of the pins 72. Thus, before the device 12 is transferred, the potential for an excessive adhesive retaining force exerted by the diaphragm 29 on the device 12 is consequently substantially eliminated because of the reduction in contact area between the device 12 and the diaphragm 29.

In a time interval subsequent to the cyclical state described with respect to FIG. 3, the respectively aligned transfer head, for example the first transfer head 38, moves downward, toward the selected device 12 as the device is lifted further by the support pins 72. During this time interval the diaphragm continues to separate from the device 12 as the device 12 is raised above the array 14.

Figure 4:
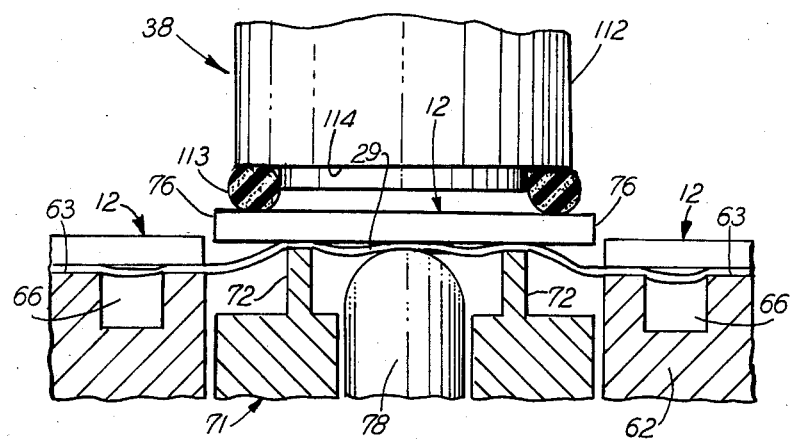

In reference to FIGS. 4 and 9, in FIG. 4 a vacuum probe, shown as a pickup tip 112 of the transfer head 38, contacts the upper surface 103 of the device 12 through a resilient O-ring type seal 113 which is held in a recessed seat 114 at the lower end of the vacuum pickup tip 112. As the seal 113 contacts the upper surface 103 of the device 12, it is not yet compressed and the vacuum in the transfer head 38 is not yet established. At the same time, however, the pushpin 78 moving upward more rapidly than the pedestal 71 reaches and passes the level to which the top surfaces 74 of the support pins 72 have lifted the device 12. As the transfer head 38 reverses its motion and retracts the pickup tip 112 immediately subsequent to the contact position of the tip 112 shown in FIG. 4, the pushpin 78 urges the device 12 into compressive contact with the seal 113 and away from the support of the support pins 72.

Figure 5:
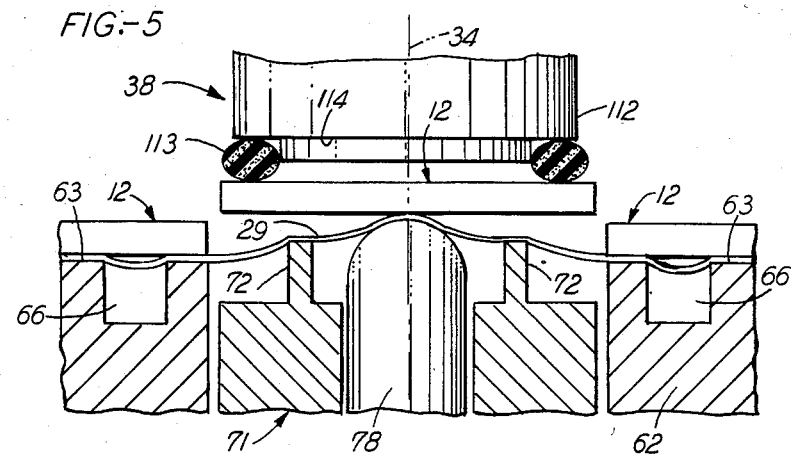

FIG. 5 shows in particular the new position of the device 12 wherein the device 12 is peripherally pushed down by a substantially balanced force of the compressed seal 113 and is pushed up in the center of the device 12 by the upward moving pushpin 78 of the lift mechanism 61. Inasmuch as the device 12 remains positively sandwiched at this point between the compressed seal 113 and the pushpin 78, the orientation of the device remains horizontal. It should be noted that at the cyclical state of FIG. 5, the diaphragm 29 has already separated from the device 12 directly above the four contact points of the support pins 72 so that the diaphragm 29 is in contact with the device 12 only at its center coincident with the pickup axis 34. The round tip of the pushpin 78 establishes an outwardly decreasing contact pressure between the device 12 and the adhesive coating on the diaphragm 29 to enhance a final separation of the diaphragm 29 from the outside toward the center of the device 12.

Figure 8:
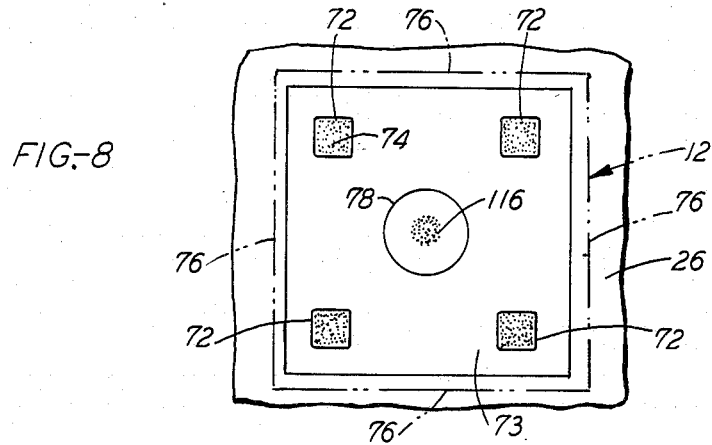
FIG. 8 shows in greater detail contact areas between an adhesive coating of such diaphragm and the device to be removed.

Positions of significant regions of contact between the device 12 and the diaphragm 29 during the described stages of lifting the device are further illustrated in FIG. 8. The four spaced contact areas between the device 12 and the diaphragm 29 are shown as four stippled regions coincident with the support pins 72. The total contact area between the device 12 and the diaphragm 29 has essentially been reduced at the stage of lifting shown in FIG. 4 to such four remaining support areas and a re-established contact area 116 coincident with the contact by the pushpin 78 in the center of the device. When the device 12 is raised from the support pins 72 as described with respect to FIG. 5, only the center contact area 116 remains.

Figure 6:
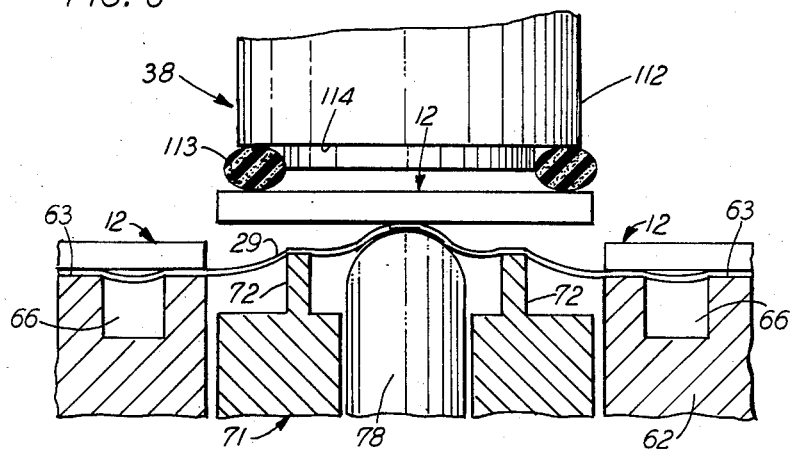

During the time interval from the first contact by the seal 113 with the upper surface of the device and a final upward urging contact against the device by the pushpin 78 as shown in FIG. 6, the vacuum force has been building in the pickup tip of the transfer head 38. Consequently, the final separation of the diaphragm 29 is supported entirely by the vacuum hold exerted by the tip 112 on the device 12. However, at that time of the transfer cycle, the vacuum within the area of the seal 113 is fully established and the remaining contact area 116 by the diaphragm is small in comparison to the area of the device 12, hence the reactive force to pulling the device 12 becomes insignificant to the vacuum force exerted by the tip 112 on the device 12.

Figure 7:
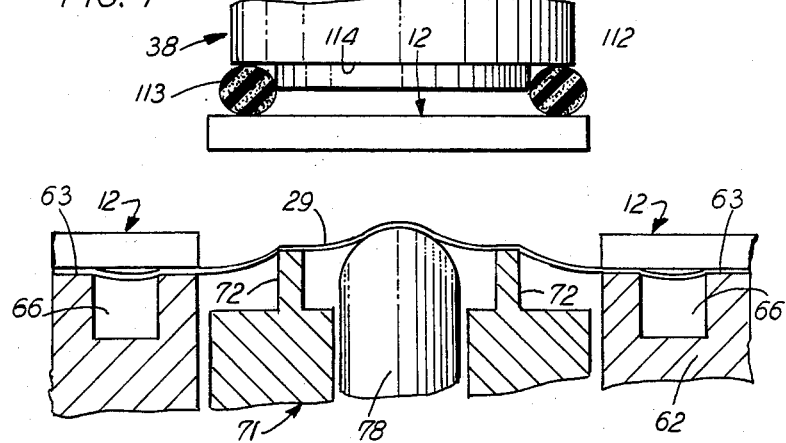

FIG. 7 shows the device 12 in a position removed from the diaphragm 29 and the pedestal 71 and the pushpin 78 progressing in their path toward their retracted start positions to ready the lift mechanism for a subsequent cycle. The diagram of FIG. 9 also shows a preferred 30 degree offset in the sinusoidal motion between the first cam lobe and the second cam lobe. Such offset in conjunction with the greater excursion of the motion of the pushpin 78 with respect to that of the pedestal 71 has resulted in consistent removals of the devices 12 from the diaphragm 29.

It should be, of course, understood that various changes and modifications can be made to the described methods of handling the devices 12 in removing them from the diaphragm 29 without departing from the spirit and scope of the described invention. Various possible changes come to mind, such as changing the lead angle of one of the cam lobes with respect to the other, or even totally changing the manner by which the pedestal 71 and the pushpin 78 are raised and lowered. Furthermore, various resilient interactions between the pushpin 78 and the transfer head 38 may be employed or a selectively regulated magnitude of the vacuum may eliminate the need for a resilient interference between the pushpin 78 and the vacuum. Furthermore, the rotational transfer motion of the swing arm 42 may be replaced with other known translational transfer movements of a transfer mechanism. As is apparent from the above, the described apparatus and handling techniques are not at all restricted to semiconductor devices with respect to which the invention has been described. Other, similarly shaped articles may benefit from the described apparatus and techniques. These are only a few examples of various changes and modifications which are possible without departing from the spirit and scope of the present invention.

What is claimed is:

1. A method of handling articles comprising:
holding an array of articles on an adhesively coated surface of a flexible diaphragm;
selecting an article from such array of articles for removal from the diaphragm;
contacting an underside of the diaphragm with a plurality of spaced support pins in peripheral regions within a vertical projection of the selected article onto the diaphragm;
moving the plurality of support pins in unison upward against the diaphragm, thereby retaining an orientation of the selected article parallel to the array while raising the article with respect to other articles in the array;
engaging the underside of the diaphragm with a pushpin at a center of the vertical projection of the selected article onto the diaphragm; and
moving the pushpin upward with respect to the plurality of support pins to urge the article out of contact with the support pins.

2. A method of handling articles according to claim 1, further comprising: contacting a top surface of the selected, raised article with a vacuum tip of a transfer head; and
urging the selected article away from the plurality of support pins and into supportive contact with the vacuum tip.

3. A method of handling articles according to claim 2, wherein contacting a top surface of the selected, raised article comprises contacting the top surface with a resilient ring in a peripheral region of the top surface of the article, the ring forming a seal about a central area of the top surface, thereby subjecting the area encompassed by the ring to a vacuum within the tip, and applying such vacuum to the tip to support the article by suction forces exerted by the tip.

4. Apparatus for handling articles, which comprises:
means for supporting an array of articles mounted adhesively coated surface of a flexible diaphragm relative to a pickup axis, such that a selected one of the articles in the array becomes centered on the pickup axis;
a plurality of support pins spacedly mounted about the pickup axis below the diaphragm within the confines of a vertical projection of the selected article centered on the pickup axis, said support pins terminating in bearing surfaces adjacent to the diaphragm in a plane parallel to the plane of the array;
means for vertically reciprocating the support pins between a retracted position below the diaphragm and a raised position above a normal plane of the diaphragm, to raise the selected article with respect to other articles in the array, said bearing surfaces of said support pins maintaining the orientation of the selected article parallel to the array; and
means for separating the diaphragm from adhesive contact with the article in regions about each of the support pins.

5. Apparatus for handling articles according to claim 4, wherein the separating means comprises means for applying a vacuum in a space below the diaphragm extending laterally at least to a region below the selected device.

6. A method of handling articles comprising:
holding an array of articles on an adhesively coated surface of a flexible diaphragm;
selecting an article from such array of articles for removal from the diaphragm;
contacting an underside of the diaphragm with a plurality of spaced support pins in peripheral regions within a vertical projection of the selected article onto the diaphragm;
moving the plurality of support pins in unison upward against the diaphragm, thereby retaining an orientation of the selected article parallel to the array while raising the article with respect to other articles in the array; and
wherein the articles are semiconductor devices, wherein selecting an article comprises indexing the diaphragm and the array of such semiconductor devices to align a predetermined semiconductor device with a vertical transfer axis, wherein contacting an underside of the diaphragm comprises contacting the underside of the diaphragm with four spaced support pins centered about such vertical transfer axis adjacnet to and removed from four corners of the predetermined semiconductor device toward the center of the projection of the device onto the diaphragm and wherein moving the plurality of support pins comprises supporting the four support pins on a common pedestal and moving the pedestal upward toward the diaphragm.

7. A method of handling articles according to claim 6, further comprising:
urging the diaphragm away from the predetermined semiconductor device in regions adjacent to and about the regions of contact of the support pins against the diaphragm.

8. A method of handling articles according to claim 7, wherein urging the diaphragm away from the predetermined semiconductor device comprises applying a vacuum to the underside of the diaphragm in unsupported regions of the diaphragm about the four support pins, thereby draping the diaphragm downward away from the semiconductor device in regions about each of such support pins, and supporting the device on adhesively coated portions of the diaphragm resting on the top surfaces of the support pins.

9. A method of handling articles according to claim 8, further comprising:
after raising the predetermined semiconductor device by the movement of the support pins above the plane of the array, contacting a top surface of said semiconductor device with a vacuum tip of a transfer head; and urging the predetermined semiconductor device away from the support pins and into supportive contact with the vacuum tip.

10. A method of handling articles according to claim 9, wherein urging the predetermined semiconductor device away from the support pins comprises:
engaging the underside of the diaphragm with a pushpin acting upward along the transfer axis; and
moving the pushpin upward with respect to the support pins to urge the diaphragm out of contact with the support pins.

11. Apparatus for handling articles supported in a planar array on an adhesively coated flexible diaphragm of a temporary support frame, which comprises:
an index table having a support surface in a plane perpendicular to a pickup axis, such support surface being adapted to locate and support the temporary support frame, the index table capable of being indexed to a predetermined position relative to the pickup axis to center a selected article of said array of articles on said pickup axis;
a support housing mounted within the confines of the index table and having a top surface in the plane of the support surface of the index table, the support housing having a guide aperture centered on said pickup axis;
a support pedestal movably mounted within said guide aperture of said support housing, an upper portion of said support pedestal carrying a plurality of support pins spaced from said pickup axis and spaced from each other, said support pins terminating in support surfaces in a support plane parallel to the plane of the support surface of the index table;
a pushpin movably mounted within an aperture through the pedestal concentrically located with respect to the pickup axis, the pushpin having an upper end shaped to non-piercingly engage a lower surface of the diaphragm;
means for reciprocatingly moving the pedestal between a lower position wherein the support surfaces of the support pins do not extend above the top surface of the support housing and a raised position at which the support surfaces extend to a first predetermined distance above the top surface of the support housing;
means for reciprocatingly moving the pushpin with respect to the support housing and with respect to the pedestal between a lower position wherein the upper end thereof is below the plane of the support surface of the index table and an upper position wherein the upper end of the pushpin extends for a second predetermined distance greater than said first predetermined distance above the top surface of the support housing; and
means, movably mounted above the plane of the support surface of the index table for moving toward and engaging a top surface of a selected article located in a position substantially centered on said pickup axis, and for attaching to the article to remove the article while maintaining a predetermined orientation of the article.

12. Apparatus for handling articles according to claim 11, wherein the plurality of support pins are four support pins which are mounted in an orthogonal array which corresponds to an orthogonal array of the articles supported on the diaphragm, and wherein the pins are spaced within an area of a vertical projection of a surface in adhesive contact with the diaphragm of a selected article centered on the pickup axis.

13. Apparatus for handling articles according to claim 12, which comprises:
means for applying a vacuum to spaces between the diaphragm and the top surface of the support housing including the space between the diaphragm and the upper portion of the support pedestal.

14. Apparatus for handling articles according to claim 11, wherein the means reciprocatingly moving the pedestal and the means for reciprocatingly moving the pushpin comprises:
a first cam follower mounted to the pedestal;
a second cam follower mounted to the pushpin; and
a camshaft mounted for rotation, said camshaft having first and second cam lobes engaging said first and second cam followers, respectively.

15. Apparatus for handling articles, which comprises:
means for supporting an array of articles mounted to an adhesively coated surface of a flexible diaphragm relative to a pickup axis, such that a selected on of the articles in the array becomes centered on the pickup axis;
a plurality of support pins spacedly mounted about the pickup axis below the diaphragm within the confines of a vertical projection of the selected article centered on the pickup axis, said support pins terminating in bearing surfaces adjacent to the diaphragm in a plane parallel to the plane of the array;
means for vertically reciprocating the support pins between a retracted position below the diaphragm and a raised position above a normal plane of the diaphragm, to raise the selected article with respect to other articles in the array, said bearing surfaces of said support pins maintaining the orientation of the selected article parallel to the array;
a support housing mounted to the apparatus, said support housing being centered on the pickup axis and having a top surface in a plane contiguous to the diaphragm, said support housing further having a guide aperture centered on the pickup axis; wherein said
means for vertically reciprocating the support pins includes a support pedestal reciprocatably mounted within said guide aperture of said support housing, said plurality of support pins being mounted to an upper end of such support pedestal; and
means for applying a vacuum between the diaphragm and the top surface of the support housing, including the region of the guide aperture, such that the diaphragm is pulled by the application of such vacuum away from adhesive contact with the selected article toward spaces about the plurality of support pins within said guide aperture.

16. Apparatus for handling articles according to claim 15, further comprising:
a pushpin slidably mounted within the support pedestal centered on the pickup axis to reciprocate with respect to the support pedestal and the diaphragm;
means for reciprocating the pushpin between a lowermost position wherein a top end of said pushpin is located below the normal plane of the diaphragm and an uppermost position wherein said top end of said pushpin extends above the plane of the bearing surfaces of the support pins when such support pins are reciprocated to their raised positions, such that when the pushpin is reciprocated toward such uppermost position, the pushpin engages the underside of the diaphragm and urges the diaphragm out of contact with the bearing surfaces of the plurality of pushpins; and means, mounted to reciprocatably move along the pickup axis above said array, for supportively attaching to a top surface of the selected article at said pickup axis, for maintaining the orientation of said selected device upon said pushpin urging the diaphragm out of contact with the bearing surfaces of the support pins, and for transferring said selected device from said array to a receiving station of the apparatus.

17. Apparatus for handling articles, which comprises:

means for supporting an array of articles mounted to an adhesively coated surface of a flexible diaphragm relative to a pickup axis, such that a selected one of the articles in the array becomes centered on the pickup axis;

a plurality of support pins spacedly mounted about the pickup axis below the diaphragm within the confines of a vertical projection of the selected article centered on the pickup axis, said support pins terminating in bearing surfaces adjacent to the diaphragm in a plane parallel to the plane of the array;

means for vertically reciprocating the support pins between a retracted position below the diaphragm and a raised position above a normal plane of the diaphragm, to raise the selected article with respect to other articles in the array, said bearing surfaces of said support pins maintaining the orientation of the selected article parallel to the array;

a transfer head movably mounted to the apparatus, such transfer head capable of movement along the pickup axis, the transfer head having a vacuum tip forming a seat at an end thereof, the seat capable of engaging and attaching to the top surface of the selected article at the pickup axis, and of maintaining the orientation of such attached article; and means for urging the selected article away from the plurality of support pins and into supportive contact with the vacuum tip.

18. Apparatus for handling articles according to claim 17, wherein the means for urging article comprises:

a pushpin movably mounted along the pickup axis below the diaphragm, said pushpin having an upper end adjacent to the plane of the diaphragm; and means for reciprocating the pushpin between a lower position below the normal plane of the diaphragm and an upper position above the raised position of the support pins, such that the pushpin bears in its upward reciprocating movement against the underside of the diaphragm, thereby urging the diaphragm out of contact with the support pins.

* * * * *